(12) United States Patent
Kim et al.

(10) Patent No.: US 10,622,585 B2
(45) Date of Patent: Apr. 14, 2020

(54) DISPLAY APPARATUS

(71) Applicant: Samsung Display Co., Ltd., Yongin-si, Gyeonggi-do (KR)

(72) Inventors: Seho Kim, Yongin-si (KR); Wonkyu Kwak, Yongin-si (KR)

(73) Assignee: Samsung Display Co., Ltd. (KR)

( * ) Notice: Subject to any disclaimer, the term of this patent is extended or adjusted under 35 U.S.C. 154(b) by 92 days.

(21) Appl. No.: 15/688,584

(22) Filed: Aug. 28, 2017

(65) Prior Publication Data

US 2018/0159074 A1    Jun. 7, 2018

(30) Foreign Application Priority Data

Dec. 6, 2016  (KR) .................. 10-2016-0165168

(51) Int. Cl.
*H01L 51/52*    (2006.01)
*H01L 27/32*    (2006.01)

(52) U.S. Cl.
CPC ...... *H01L 51/5253* (2013.01); *H01L 27/3246* (2013.01); *H01L 27/3248* (2013.01); *H01L 51/5246* (2013.01); *H01L 27/3244* (2013.01)

(58) Field of Classification Search
CPC ............ H01L 51/5253; H01L 27/3246; H01L 27/3244; H01L 51/5246
See application file for complete search history.

(56) References Cited

U.S. PATENT DOCUMENTS

| 7,109,653 | B2 | 9/2006 | Imamura |
| 9,412,972 | B2 | 8/2016 | Shim et al. |
| 9,425,434 | B2 | 8/2016 | Lee et al. |
| 2003/0164674 | A1* | 9/2003 | Imamura ............... H05B 33/04 |
| | | | 313/493 |
| 2010/0295759 | A1 | 11/2010 | Tanaka |
| 2014/0126131 | A1 | 5/2014 | Lee |
| 2015/0036299 | A1 | 2/2015 | Namkung et al. |
| 2016/0124254 | A1 | 5/2016 | Yoon et al. |
| 2016/0204373 | A1 | 7/2016 | Park |
| 2016/0233248 | A1 | 8/2016 | Kwak et al. |

FOREIGN PATENT DOCUMENTS

| JP | 2008-165251 | 7/2008 |
| JP | 2010-272270 | 12/2010 |
| KR | 10-2012-0010823 | 2/2012 |
| KR | 10-2014-0057050 | 5/2014 |
| KR | 10-2015-0015257 | 2/2015 |
| KR | 10-2016-0000980 | 1/2016 |

(Continued)

*Primary Examiner* — Elias Ullah
(74) *Attorney, Agent, or Firm* — Innovation Counsel LLP

(57) ABSTRACT

A display apparatus may include a substrate, a display unit, a first dam unit, an insulating unit, and a first metal layer. The display unit may overlap the substrate. The first dam unit may at least partially surround the display unit. A first trench may be positioned between the first dam unit and the display unit. The insulating unit may be disposed between the substrate and the first dam unit, may have an insulating portion, and may have a first opening set. The first opening set may be disposed between the insulating portion and the display unit. The insulating portion may at least partially surround the display unit. The first metal layer may have a second opening set positioned over the first opening set.

20 Claims, 8 Drawing Sheets

(56) References Cited

FOREIGN PATENT DOCUMENTS

| | | |
|---|---|---|
| KR | 10-2016-0032800 | 3/2016 |
| KR | 10-2016-0054125 | 5/2016 |
| KR | 10-2016-0064373 | 6/2016 |
| KR | 10-2016-0080289 | 7/2016 |
| KR | 10-2016-0087982 | 7/2016 |
| KR | 10-2016-0097449 | 8/2016 |

\* cited by examiner

DISPLAY APPARATUS

CROSS-REFERENCE TO RELATED APPLICATION

This application claims the benefit of Korean Patent Application No. 10-2016-0165168, filed on Dec. 6, 2016, in the Korean Intellectual Property Office, the disclosure of the Korean Patent Application is incorporated herein in its entirety by reference.

BACKGROUND

1. Field

The technical field is related to a display apparatus.

2. Description of the Related Art

A typical organic light-emitting display apparatus may include thin film transistors and organic light-emitting devices formed on a substrate, and the organic light-emitting devices may emit light for displaying images. The organic light-emitting display apparatus may be used as a display unit of a compact product such as a mobile phone or a display unit of a large product such as a television.

An organic light-emitting device may include a light-emitting layer provided between a pixel electrode and a counter electrode. Since the organic light-emitting device is characteristically vulnerable to moisture, an encapsulation layer covering the organic light-emitting device is typically provided above the organic light-emitting device on the substrate.

However, the encapsulation layer provided above the organic light-emitting device may cause undesirable dead space in the associated display apparatus, such that the display area of the display apparatus may be undesirably limited.

SUMMARY

One or more embodiments may be related to display apparatuses which have a maximum display area and are resistant to external moisture.

According to one or more embodiments, a display apparatus includes a substrate having a first region and a second region outside the first region, a display unit arranged in the first region and including a display element, a first dam unit arranged in the second region to surround at least part of the outside of the display unit, an insulating unit arranged across the first region and the second region and disposed between the substrate and the first dam unit, and having a first opening disposed in the second region to surround the at least part of the outside of the display unit, and a first metal layer having a second opening at a position corresponding to the first opening.

The first opening may be disposed between the substrate and the first dam unit.

The first opening may be filled with an organic material layer.

An upper surface of the organic material layer may be identical to or lower than an upper surface of the first metal layer.

An upper surface of the organic material layer may be higher than an upper surface of the first metal layer.

The organic material layer may be disposed only in the first opening and the second opening.

The organic material layer may directly contact an inner side surface of the first opening.

The display unit may further include a second metal layer arranged across the first region and the second region, and the second metal layer may be disposed between the organic material layer and the first dam unit.

The display unit may further include a thin film transistor for supplying the display element and a pixel electrode corresponding to the display element, and the second metal layer may include a same material as the pixel electrode.

The thin film transistor may include a semiconductor layer, a gate electrode, and a source electrode or a drain electrode, and the first metal layer may include a same material as the source electrode or the drain electrode.

The display apparatus may further include a second dam unit arranged in the second region to surround an outside of the first dam unit.

A height of the second dam unit may be greater than a height of the first dam unit.

The second metal layer may extend to the second dam unit.

The first opening may expose at least part of the substrate.

The insulating unit may include one or more inorganic insulating layers.

The first opening may discontinuously be disposed outside the display unit.

A width of the first opening may be smaller than a width of the first dam unit.

A width of the second opening may be smaller than a width of the first dam unit.

The first dam unit may be arranged to cover the organic material layer.

An embodiment may be related to a display apparatus. The display apparatus may include a substrate, a display unit, a first dam unit (or first barrier unit), an insulating unit, and a first metal layer. The display unit may overlap the substrate. The display unit may include an emissive element. The first dam unit may at least partially surround the display unit. A first trench (or first moat) may be positioned between the first dam unit and the display unit. The insulating unit may be disposed between the substrate and the first dam unit, may have an insulating portion, and may have a first opening set. The first opening set may be disposed between the insulating portion and the display unit. The insulating portion may at least partially surround the display unit. The first metal layer may have a second opening set positioned over the first opening set.

The first opening set may be disposed between the substrate and the first dam unit.

The display apparatus may include an organic material layer at least partially disposed inside the first opening set.

A first surface of the organic material layer may be flush with a first surface of the first metal layer or may be positioned closer to the substrate than the first surface of the first metal layer. A second surface of the organic material layer may be opposite the first surface of the organic material layer and may be positioned between the substrate and the first surface of the organic material layer. A second surface of the first metal layer may be opposite the first surface of the metal layer and may be positioned between the substrate and the first surface of the first metal layer.

A first surface of the organic material layer may be positioned farther from the substrate than a first surface of the first metal layer. A second surface of the organic material layer may be opposite the first surface of the organic material layer and may be positioned between the substrate and the first surface of the organic material layer. A second surface of the first metal layer may be opposite the first surface of the metal layer and may be positioned between the substrate and the first surface of the first metal layer.

The organic material layer may be disposed completely inside a combination of the first opening set and the second opening set.

The organic material layer may directly contact an inner (side) surface of the first opening set.

The display apparatus may include a second metal layer disposed between the organic material layer and the first dam unit.

The display unit may include a pixel electrode overlapping the emissive element and may include a transistor electrically connected to the pixel electrode. A material of the second metal layer may be identical to a material of the pixel electrode.

The transistor may include a semiconductor layer, a gate electrode, and at least one of a source electrode and a drain electrode. A material of the first metal layer may be identical to a material of the at least one of the source electrode and the drain electrode.

The display apparatus may include a second dam unit (or second barrier unit) at least partially surrounding the first dam unit. A second trench (or second moat) may be positioned between the second dam unit and the first dam unit.

A maximum height of the second dam unit relative to the substrate may be greater than a maximum height of the first dam unit relative to the substrate.

The second metal layer may directly contact the second dam unit.

The first opening set may expose at least part of the substrate.

The insulating unit may include one or more inorganic insulating layers.

The first opening set may include openings that are separated from one another by insulating portions of the insulating layer.

The first opening set may be narrower than the first dam unit in a direction parallel to the substrate. Two edges of the first opening set may be positioned between two edges of the first dam unit.

The second opening set may be narrower than the first dam unit in a directly parallel to the substrate. Two edges of the second opening set may be positioned between two edges of the first dam unit.

The first dam unit may cover the organic material layer such that two edges of the organic material layer are positioned between two edges of the first dam unit.

A maximum height of the first dam unit relative to the substrate may be greater than a maximum height of the emissive element relative to the substrate.

DETAILED DESCRIPTION

Figure 1:
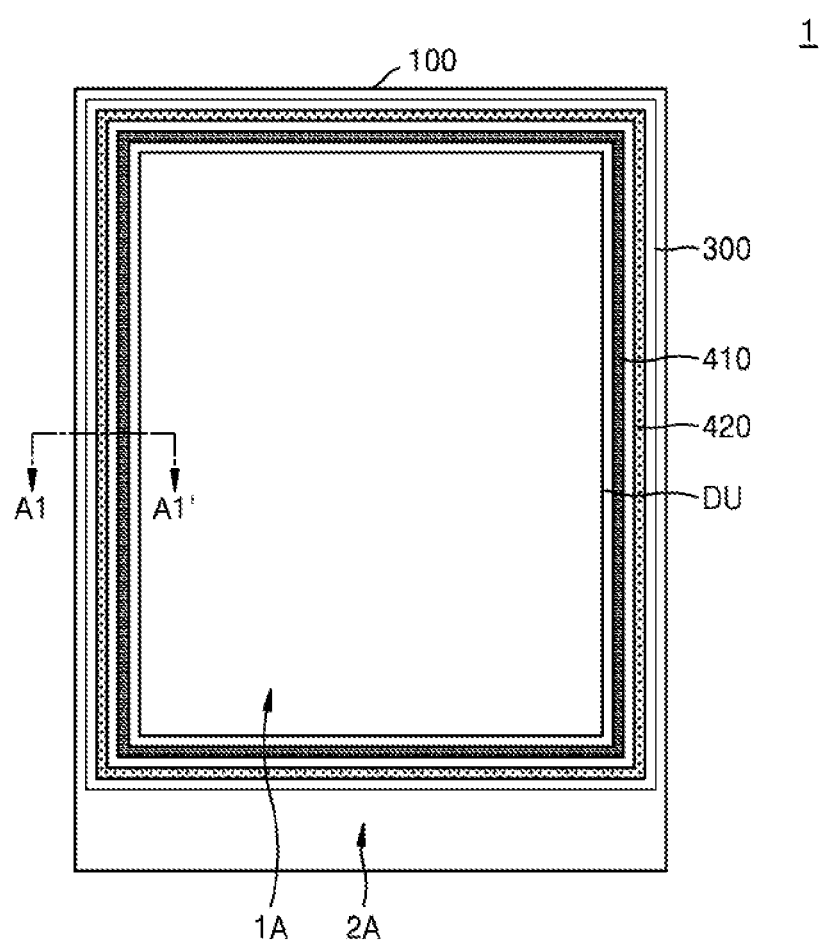
FIG. 1 is a schematic plan view of a display apparatus according to an embodiment.

Example embodiments are illustrated in the drawings and described in detail in the written description. Practical embodiments encompass all changes, equivalents, and substitutes applicable to the described embodiments. Like reference numerals may refer to like elements.

While such terms as "first," "second," etc., may be used to describe various components, such components must not be limited to the above terms. The above terms may be used to distinguish one component from another. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terms "comprises" and/or "comprising" used herein specify the presence of stated features or components, but do not preclude the presence or addition of one or more other features or components.

When a first element (such as a layer, region, or component) is referred to as being "on" a second element, the first element can be directly or indirectly on the second element. That is, one or more intervening elements may be present between the first element and the second element.

Sizes of components in the drawings may be exaggerated for convenience of explanation.

An opening may mean an opening set. An opening set may mean a set of openings that includes one or more openings. A grove portion may mean a grove portion set, or a set of groove portions that includes one or more groove portions. A groove portion may represent an organic material member positioned inside the groove portion.

Figure 2:
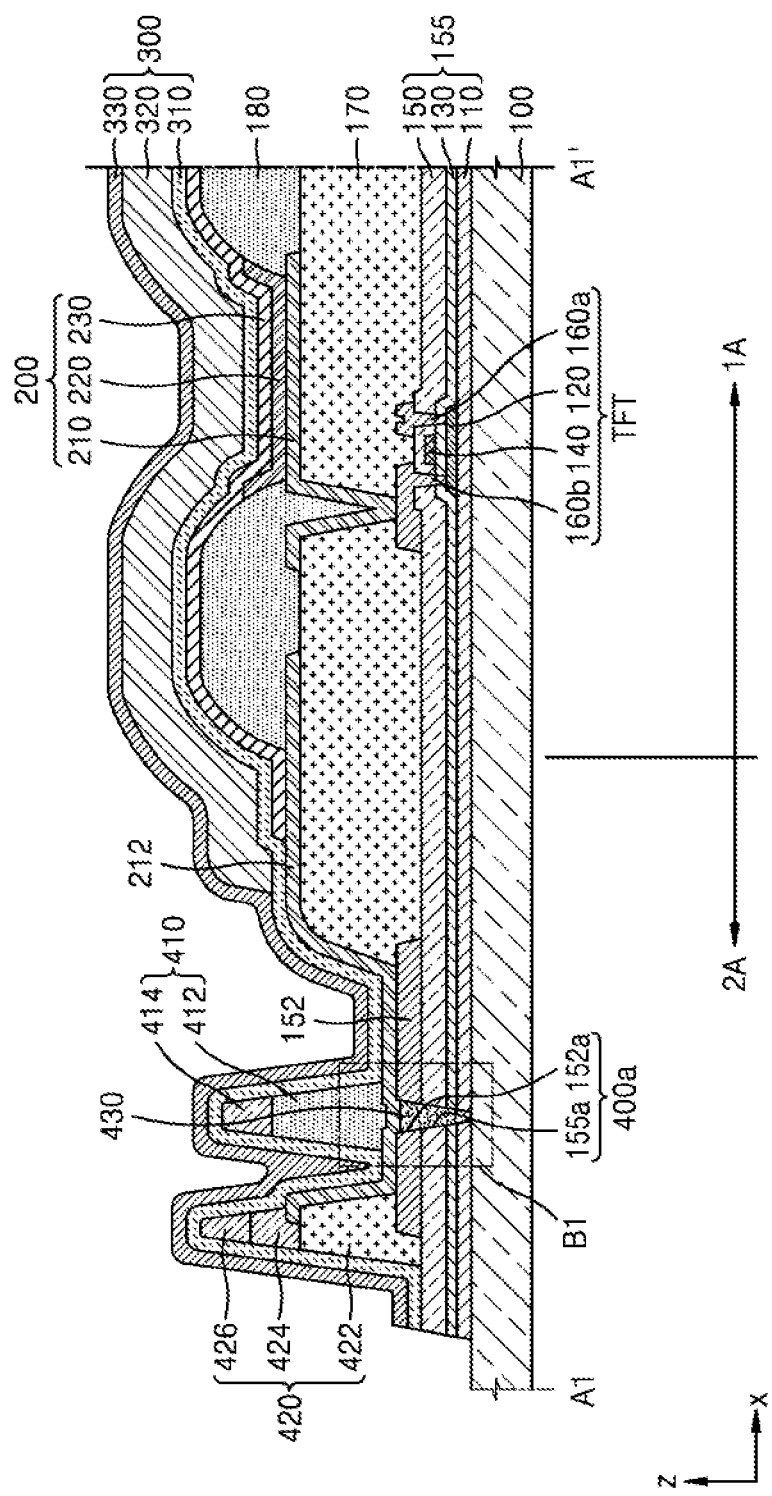
FIG. 2 is a schematic cross-sectional view taken along a line A1-A1' in the display apparatus of FIG. 1 according to an embodiment.
Figure 3:
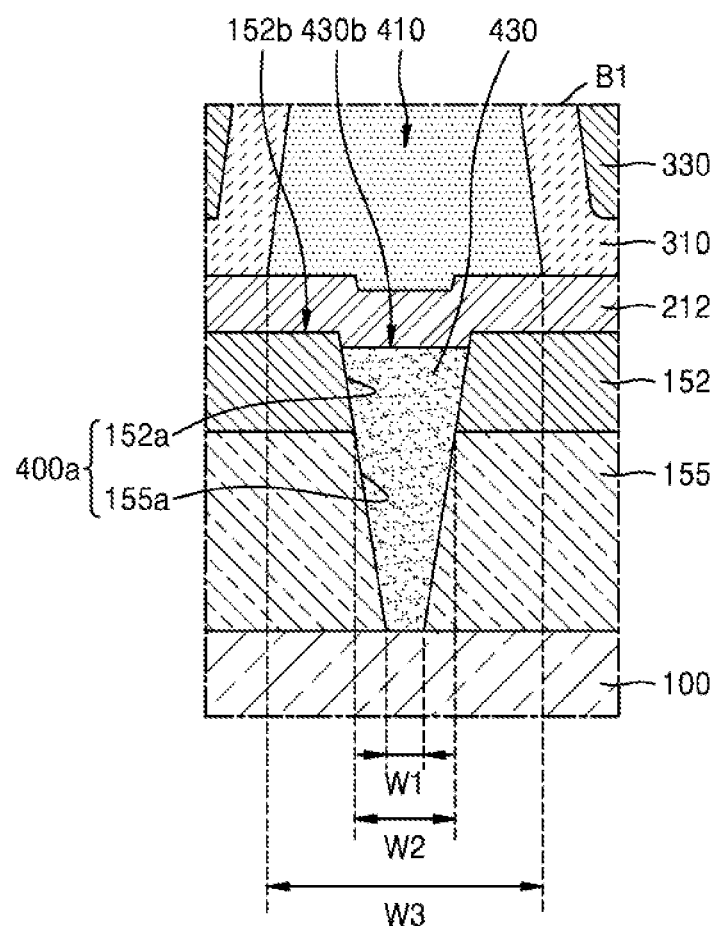
FIG. 3 is a schematic cross-sectional view of a portion B1 indicated in FIG. 2 according to an embodiment.

FIG. 1 is a schematic plan view of a display apparatus 1 according to an embodiment. FIG. 2 is a schematic cross-sectional view taken along a line A1-A1' in the display apparatus 1 of FIG. 1. FIG. 3 is a schematic enlarged cross-sectional view of a portion B1 in the display apparatus 1 of FIG. 1.

Referring to FIGS. 1 and 2, the display apparatus 1 may include a substrate 100, a display unit DU disposed on the substrate 100 and including a display element 200, a first dam unit 410 (or barrier unit 410) disposed outside the display unit DU, an insulating unit 155 having a first opening 155a disposed on the substrate 100, and a first metal layer 152 having a second opening 152a at a position corresponding to the first opening 155a.

The substrate 100 may be formed of at least one of various materials, for example, a glass material, a metal material, or a plastic material such as polyethylen terephthalate (PET), polyethylen naphthalate (PEN), polyimide, and the like. If the substrate 100 is formed of a thin glass or metal material or formed of a plastic material, the substrate 100 may have flexible characteristics. As illustrated in FIG. 1, the substrate 100 may have a rectangular shape, or may be formed in at least one of various shapes such as a circle, an ellipse, and the like, depending on the shape of the display unit DU.

The substrate 100 may have a first region 1A and a second region 2A surrounding the outside of the first region 1A. The first region 1A may be understood as a display area where a plurality of display elements 200 is arranged. In an embodiment, the display element 200 is an organic light-emitting element.

The second region 2A is located in the periphery of the first region 1A, where the display elements 200 are not arranged and a wiring or a circuit portion may be arranged. Referring to FIG. 1, the first region 1A is located at the central portion of the substrate 100 and the second region 2A surrounds the outside of the first region 1A and includes the edge of the substrate 100.

In FIG. 1, according to an embodiment, the substrate 100 has a rectangular shape. Accordingly, the display unit DU located at the center of the substrate 100 may also have a rectangular shape. Accordingly, the second region 2A may surround the four sides of the display unit DU.

The first dam unit 410 and the second dam unit 420 may be located in the second region 2A, which is the outside of the display unit DU. In other words, the first dam unit 410 and the second dam unit 420 may surround (and enclose) the display unit DU in a plan view of the display apparatus 1. FIG. 1 illustrates that the first dam unit 410 and the second dam unit 420 completely surround (all four sides of) the display unit DU. In one or more embodiments, one or more dam units may partially surround a display unit without enclosing the display unit, as illustrated with reference to FIGS. 7 and 8.

Each of the first dam unit 410 and the second dam unit 420 may include a plurality of layers. The layers may include an organic material or an inorganic material. The first dam unit 410 and the second dam unit 420 may be simultaneously formed when the display unit DU is formed in the first region 1A, or may be separately formed.

Referring to FIGS. 1 and 2 altogether, the insulating unit 155 may be disposed on the substrate 100, and the insulating unit 155 may be disposed on the entire surface of the substrate 100 over the first region 1A and the second region 2A of the substrate 100. Although FIGS. 1 and 2 illustrate that the insulating unit 155 is disposed on the entire surface of the substrate 100, not at the outermost edge of the substrate 100, in other embodiments, the insulating unit 155 may be arranged extending to an end portion of the substrate 100.

The insulating unit 155 may include one or more inorganic insulating layers, as illustrated in FIG. 2. The inorganic insulating layer may include, for example, a first insulating layer 110, a second insulating layer 130, and a third insulating layer 150. The first insulating layer 110 may be a buffer layer disposed on the substrate 100. The second insulating layer 130 may be understood as a gate insulating layer for insulating between a semiconductor layer 120 and a gate electrode 140 of a thin film transistor (TFT), which is described later, in the first region 1A, and the third insulating layer 150 may be understood as an interlayer insulating layer for insulating between the gate electrode 140 and a source electrode 160a, or between the gate electrode 140 and a drain electrode 160b, of the TFT in the first region 1A.

As illustrated in FIG. 2, the insulating unit 155 may include a groove portion 400a disposed under the first dam unit 410. In other words, the groove portion 400a may be located between the substrate 100 and the first dam unit 410. The groove portion 400a may include the first opening 155a and the second opening 152a. Referring back to FIG. 1, as described above, the first dam unit 410 may surround (and enclose) the outside of the display unit DU. Although not illustrated in FIG. 1, the groove portion 400a may be disposed along an area where the first dam unit 410 is arranged.

First, the first region 1A of the substrate 100 is described below.

The first insulating layer 110 formed of silicon oxide or silicon nitride may be arranged on the substrate 100 to planarize the surface of the substrate 100 or to prevent intrusion of impurities into the semiconductor layer 120 of the TFT, and the semiconductor layer 120 may be disposed on the first insulating layer 110. In some cases, a barrier layer in addition to the first insulating layer 110 may be further arranged on the substrate 100. In an embodiment, the barrier layer may be disposed on the first insulating layer 110. Also, in another embodiment, the buffer layer may not be arranged on the substrate 100. In an embodiment, the semiconductor layer 120 may be directly arranged on the substrate 100, and the second insulating layer 130 may be directly arranged on the substrate 100 to cover the semiconductor layer 120.

The gate electrode 140 is disposed above the semiconductor layer 120. The source electrode 160a and the drain electrode 160b are electrically connected to each other according to a signal applied to the gate electrode 140. The gate electrode 140 may be formed of one or more of materials, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), in a single layer or a multilayer, considering adhesion with an adjacent layer, surface flatness of a layer to be laminated, and workability.

In this state, to secure insulation between the semiconductor layer 120 and the gate electrode 140, the second insulating layer 130 formed of silicon oxide and/or silicon nitride may be provided between the semiconductor layer 120 and the gate electrode 140.

The third insulating layer 150 may be disposed above the gate electrode 140. The third insulating layer 150 may be formed of a material such as silicon oxide or silicon nitride in a single layer or a multilayer. In another embodiment, the third insulating layer 150 may be formed of an organic material in a single layer or a multilayer.

The source electrode 160a and the drain electrode 160b are disposed on the third insulating layer 150. Each of the source electrode 160a and the drain electrode 160b is electrically connected to the semiconductor layer 120 through a contact hole formed in the third insulating layer 150 and the second insulating layer 130. The source electrode 160a and the drain electrode 160b may be formed of one or more of materials, for example, Al, Pt, Pd, Ag, Mg, Au, Ni, Nd, Ir, Cr, Li, Ca, Mo, Ti, W, and Cu, in a single layer or a multilayer, considering conductivity.

Although not illustrated, a protection layer covering the TFT may protect the TFT having the above structure. The protection layer may be formed of an inorganic material, for example, silicon oxide, silicon nitride, or silicon oxynitride.

A via layer 170 may be disposed on the substrate 100. In an embodiment, the via layer 170 may be a planarized layer (or planarization layer) or a protection layer. When the display element 200 is arranged above the TFT, the via layer 170 may substantially planarize the upper surface of the TFT, and protect the TFT and various elements. The via layer 170 may be formed of, for example, an acrylic-based organic material or benzocyclobutene (BCB).

A pixel defining layer 180 may be arranged above the TFT. The pixel defining layer 180 may be disposed on the via layer 170, and may have an opening for defining a pixel area. The pixel defining layer 180 may define a pixel area of each pixel by means of the opening.

The pixel defining layer 180 may be provided as an organic insulating layer, for example. The organic insulating layer may include, for example, acrylic-based polymers such as polymethyl methacrylate (PMMA), polystyrene (PS), polymer derivatives having a phenol group, imide-based polymers, arylether-based polymers, amide-based polymers, fluorine-based polymers, p-xylene based polymers, vinyl alcohol-based polymers, and mixtures thereof.

The display element 200 may be arranged on the via layer 170. The display element 200 may include a pixel electrode 210, an intermediate layer 220 including an emissive layer (EML), and a counter electrode 230.

The pixel electrode 210 may be a (semi-) transparent electrode or a reflective electrode. When the pixel electrode 210 is formed of a (semi-) transparent electrode, the pixel electrode 210 may be formed of for example, ITO, IZO, ZnO, $In_2O_3$, IGO, or AZO. When the pixel electrode 210 is formed of a reflective electrode, the pixel electrode 210 may have a reflective layer formed of Ag, Mg, Al, Pt, Pd, Au, Ni, Nd, Ir, Cr, and a compound thereof, and a layer formed of ITO, IZO, ZnO, $In_2O_3$, IGO, or AZO. In an embodiment, the pixel electrode 210 may be formed of a variety of materials and may have a single layer structure or a multilayer structure.

The intermediate layer 220 may be arranged in each pixel area defined by the pixel defining layer 180. The intermediate layer 220 may include the EML for emitting light by an electrical signal and, in addition to the EML, may include a hole injection layer (HIL) arranged the EML and the pixel electrode 210, a hole transport layer (HTL), an electron transport layer (ETL) arranged between the EML and the counter electrode 230, and an electron injection layer (EIL), which are stacked in a structure of a single layer or a multilayer. The intermediate layer 220 is not necessarily limited thereto and may have a variety of structures.

The counter electrode 230 covering the intermediate layer 220 including the EML, and facing the pixel electrode 210, may be arranged across the entire surface of the substrate 100. The counter electrode 230 may be formed of a (semi-) transparent electrode or a reflective electrode.

The intermediate layer 220 may be a low-molecular organic material or a polymer organic material.

When the intermediate layer 220 is a low-molecular organic material, the HTL, the HIL, the ETL, and the EIL may be stacked with respect to the EML. In addition, various layers may be stacked, if necessary. An organic material that is usable in this regard may include, for example, copper phthalocyanine (CuPc), N'-di(naphthalene-1-yl)-N, N'-diphenyl-benzidine (NPB), or tris-8-hydroxyquinoline aluminum (Alq3).

When the intermediate layer 220 is a polymer organic material, the intermediate layer 220 may further include the HTL in addition to the EML. The HTL may include poly-(2,4)-ethylene-dihydroxy thiophene (PEDOT) or polyaniline (PANI). An organic material that may be used in this regard may include poly-phenylenevinylene (PPV)-based and polyfluorene-based polymer organic materials. Furthermore, an inorganic material may be further provided between the intermediate layer 220 and each of the pixel electrode 210 and the counter electrode 230.

In this state, the HTL, the HIL, the ETL, and the EIL may be integrally formed on the entire surface of the substrate 100, or only the EML may be formed in an inkjet printing process for each pixel. In an embodiment, the HTL, the HIL, the ETL, and the EIL may be located in an inlet portion.

When the counter electrode 230 is formed of a (semi-) transparent electrode, the counter electrode 230 may include a layer formed of metal with a small work function, that is, Li, Ca, LiF/Ca, LiF/Al, Al, Ag, Mg, and a compound thereof, and a (semi-) transparent conductive layer formed of ITO, IZO, ZnO, or $In_2O_3$. When the counter electrode 230 is formed of a reflective electrode, the counter electrode 230 may include a layer formed of Li, Ca, LiF/Ca, LiF/Al, Al, Ag, Mg, and a compound thereof. The structure and material of the counter electrode 230 are not limited thereto and may be variously modified.

An encapsulation portion 300 may be disposed above the display element 200 covering the display element 200. Although not illustrated, in another embodiment, functional layers such as a polarized layer may be further provided between the counter electrode 230 and the encapsulation portion 300.

The encapsulation portion 300 may include a first inorganic layer 310, a second inorganic layer 330, and an organic layer 320 provided between the first inorganic layer 310 and the second inorganic layer 330. The encapsulation portion 300 may have a function to hermetically seal the display element 200 that is vulnerable to external moisture. Furthermore, to improve a sealing effect, the encapsulation portion 300 may have a multilayer structure in which an inorganic layer and an organic layer are alternately stacked on each other. Furthermore, the organic layer 320 of the encapsulation portion 300 may be thicker that the first inorganic layer 310 and the second inorganic layer 330.

The first inorganic layer 310 and the second inorganic layer 330 may be displayed on the entire surface of the substrate 100 across the first region 1A and the second region 2A. The first inorganic layer 310 and the second inorganic layer 330 may include one or more materials selected from, for example, silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). In this state, the materials forming the first inorganic layer 310 and the second inorganic layer 330 may be identical or different from each other.

The organic layer 320 may be provided between the first inorganic layer 310 and the second inorganic layer 330 for flexibility of the encapsulation portion 300. The organic layer 320 may be hermetically sealed by the first inorganic layer 310 and the second inorganic layer 330. In other words, a side surface of the organic layer 320 may be covered by the first inorganic layer 310 and the second inorganic layer 330. In other words, the organic layer 320 may be completely covered by the second inorganic layer 330 arranged on the organic layer 320. Edges of the first inorganic layer 310 and the second inorganic layer 330 covering the side surface of the organic layer 320 may directly contact each other. Since the organic layer 320 is a passage for the intrusion of external moisture, the organic layer 320 is completely sealed by the first inorganic layer 310 and the second inorganic layer 330. The organic layer 320 may include one or more materials selected from, for example, acrylic-based resin, methacrylic-based resin, polyisoprene, vinyl-based resin, epoxy-based resin, urethane-based resin, cellulose-based resin, and perylene-based resin.

FIG. 2 illustrates that an end of the insulating unit 155 and ends of the first and second inorganic layers 310 and 330 extending to the edge of the substrate 100 match each other.

In an embodiment, the end of the insulating unit 155 and the ends of the first and second inorganic layers 310 and 330 may not match each other. In an embodiment, the end of the first inorganic layer 310 and the end of the second inorganic layer 330 may not match each other.

FIG. 2 illustrates that the insulating unit 155 and the first and second inorganic layers 310 and 330 do not extend to the end of the substrate 100 and expose at least a part of the edge of the substrate 100. In an embodiment, the insulating unit 155 and the first and second inorganic layers 310 and 330 may extend to the end of the substrate 100, covering the entire surface of the substrate 100.

Next, the second region 2A of the substrate 100 is described below with reference to FIG. 2.

The second region 2A of the substrate 100 may be understood as an area surrounding the outside of the first region 1A and including the edge of the substrate 100. Circuit portions, interconnection lines, and the like, except for the display element 200, may be arranged in the second region 2A. Furthermore, the via layer 170 and the pixel defining layer 180 as well as the insulating unit 155 may be disposed across at least a part of the first region 1A and the second region 2A.

In an embodiment, the insulating unit 155 located in the second region 2A may have the first opening 155a formed along an outside of the first region 1A. In other words, the first opening 155a may be located in the second region 2A adjacent to the first region 1A. The first opening 155a may form a closed loop along the first region 1A, or may be formed in an open type in another embodiment.

The first opening 155a, as illustrated in FIG. 2, may expose at least part of the substrate 100. In other words, the first opening 155a may penetrate through the first insulating layer 110, the second insulating layer 130, and the third insulating layer 150 included in the insulating unit 155.

The first metal layer 152 may be disposed on the insulating unit 155. The first metal layer 152 may be arranged on the insulating unit 155 located in the second region 2A, particularly on the third insulating layer 150 as illustrated in FIG. 2. The first metal layer 152 may include the same material as that of the source electrode 160a or the drain electrode 160b of the TFT located in the first region 1A. The source electrode 160a and the drain electrode 160b of the TFT may be disposed on the third insulating layer 150 corresponding to the interlayer insulating layer. Accordingly, the first metal layer 152 may be disposed on the third insulating layer 150. The first metal layer 152 may be formed of one or more materials of, for example, Al, Pt, Pd, Ag, Mg, Au, Ni, Nd, Ir, Cr, Li, Ca, Mo, Ti, W, and Cu, in a single layer or a multilayer.

The first metal layer 152 may have the second opening 152a. The second opening 152a may be provided corresponding to the first opening 155a. Although FIG. 2 illustrates that the first opening 155a and the second opening 152a have the same inner side surface, an inner side surface of the first opening 155a and an inner side surface of the second opening 152a may not match each other in another embodiment. The first opening 155a and the second opening 152a may be understood as the groove portion 400a located outside the display unit DU.

The groove portion 400a may be filled with an organic material layer 430. In other words, the first opening 155a and the second opening 152a may be filled with the organic material layer 430. The organic material layer 430 may include, for example, acrylic-based polymers such as PMMA, PS, polymer derivatives having a phenol group, imide-based polymers, arylether-based polymers, amide-based polymers, fluorine-based polymers, p-xylene based polymers, vinyl alcohol-based polymers, and mixtures thereof.

In an embodiment, as shown in FIG. 3, an upper surface 430b of the organic material layer 430 may be identical to or lower than an upper surface 152b of the first metal layer 152. In an embodiment, a lower surface of the organic material layer 430 may directly contact at least part of the substrate 100 and may directly contact the inner side surface of the first opening 155a. In an embodiment, the organic material layer 430 may be disposed only in the first opening 155a and the second opening 152a.

Although the organic material layer 430 may be formed to be identical to or lower than the upper surface 152b of the first metal layer 152, as described above, the height of the organic material layer 430 may be adjusted by using a half-tone or full-tone mask according to the thickness of the insulating unit 155 and/or the first metal layer 152.

The first dam unit 410 may be disposed above the groove portion 400a. In other words, the first opening 155a and the second opening 152a may be located between the substrate 100 and the first dam unit 410. In an embodiment, the first dam unit 410 is illustrated to include a first-1 layer 412 and a first-2 layer 414, other layers may be further included in some cases. The first-1 layer 412 may include the same material as the pixel defining layer 180 located in the first region 1A. In an embodiment, the first-2 layer 414 may include the same material as the pixel defining layer 180, may be the organic material layer 430 formed in a separate process, or may be an inorganic layer. In an embodiment, the first-1 layer 412 may include the same material as the via layer 170. In an embodiment, the first-2 layer 414 may include the same material as the pixel defining layer 180. Furthermore, in an embodiment, unlike the illustration of FIG. 2, a second metal layer 212 may be disposed between the first-1 layer 412 and the first-2 layer 414.

The second metal layer 212 may be disposed between the first dam unit 410 and the groove portion 400a. The second metal layer 212 may be arranged across a part of the first region 1A and a part of the second region 2A. The second metal layer 212 may include the same material as the pixel electrode 210 of the display unit DU.

The second dam unit 420 may be located outside the first dam unit 410. The second dam unit 420 may be disposed spaced apart from the first dam unit 410 by a certain interval, and may surround the first dam unit 410. In an embodiment, the height of the second dam unit 420 may be greater than the height of the first dam unit 410. The first dam unit 410 and the second dam unit 420 may be provided to prevent overflow of the organic layer 320 during the formation of the encapsulation portion 300. Although FIG. 2 illustrates that the organic layer 320 of the encapsulation portion 300 is provided to an end portion area of the pixel defining layer 180, in another embodiment, the organic layer 320 may be arranged extending to the first dam unit 410, In other words, the organic layer 320 does not overflow to the edge of the substrate 100 by the first dam unit 410, and a part of the organic layer 320 flowing over the first dam unit 410 may be blocked by the second dam unit 420, thereby the prevention of the overflow of the organic layer 320.

The second dam unit 420 may include a second-1 layer 422, a second-2 layer 424, and a second-3 layer 426. Although FIG. 2 illustrates that the second dam unit 420 includes the second-1 layer 422, the second-2 layer 424, and the second-3 layer 426, the second dam unit 420 may further include other layers, or may include only the second-1 layer 422 and the second-2 layer 424. The second-1 layer 422 may include the same material as the via layer 170 located in the first region 1A. The second-2 layer 424 may include the same material as the pixel defining layer 180. The second-3 layer 426, like the second-2 layer 424, may include the same material as the pixel defining layer 180, or may be the organic material layer 430 or an inorganic layer which is formed in a separate process.

The second metal layer 212 may be partially disposed between the second-1 layer 422 and the second-2 layer 424 of the second dam unit 420. In an embodiment, an end portion of the second metal layer 212 is not disposed between the second-1 layer 422 and the second-2 layer 424.

Referring to FIG. 3, in an embodiment, the first opening 155a may have a first width w1, the second opening 152a ma have a second width w2, and the first dam unit 410 may have a third width w3. In FIGS. 2 and 3, the inner side surfaces of the first opening 155a and the second opening 152a and side surfaces of the first dam unit 410 are included by a certain angle, not a right angle, with respect to the substrate 100. In other words, the insulating unit including the first opening 155a, the first metal layer 152 including the second opening 152a, and the side surfaces of the first dam unit 410 are illustrated to have a trapezoidal shape. Accordingly, although FIG. 3 illustrates the width with respect to lower portions of the first opening 155a, the second opening 152a, and the first dam unit 410, the "width" may be interpreted to be a width that is not limited to the upper or lower portion of each member. For example, the first width w1 may be a width of the lower portion, the upper portion, or a middle portion of the first opening 155a.

In an embodiment, the first width w1 of the first opening 155a may be smaller than the third width w3 of the first dam unit 410. Furthermore, the second width w2 of the second opening 152a may be smaller than the third width w3 of the first dam unit 410. When the first width w1 of the first opening 155a and the second width w2 of the second opening 152a are larger than the third width w3 of the first dam unit 410, the height of the first dam unit 410 may be reduced compared to the height according to a related art. In an embodiment, as described above, since the prevention of the overflow of the organic layer 320 that is a function of the first dam unit 410 is not easy, in order to maintain the first dam unit 410, the first and second openings 155a and 152a may be formed such that each of the first width w1 of the first opening 155a and the second width w2 of the second opening 152a is smaller than the third width w3 of the first dam unit 410.

In this state, the first dam unit 410 may cover the organic material layer 430. As described above, as each of the first width w1 of the first opening 155a and the second width w2 of the second opening 152a is smaller than the third width w3 of the first dam unit 410, the organic material layer 430 filling the groove portion 400a may be completely covered by the first dam unit 410.

In the display apparatus 1 according to an embodiment, a crack prevention dam may be provided, in which the groove portion 400a including the first opening 155a and the second opening 152a is provided under the first dam unit 410 and the groove portion 400a is filled with the organic material layer 430. The crack prevention dam may block external shock transferred from the edge of the substrate 100 so that transfer of a crack due to the external shock to the display unit DU may be effectively prevented.

Figure 4:
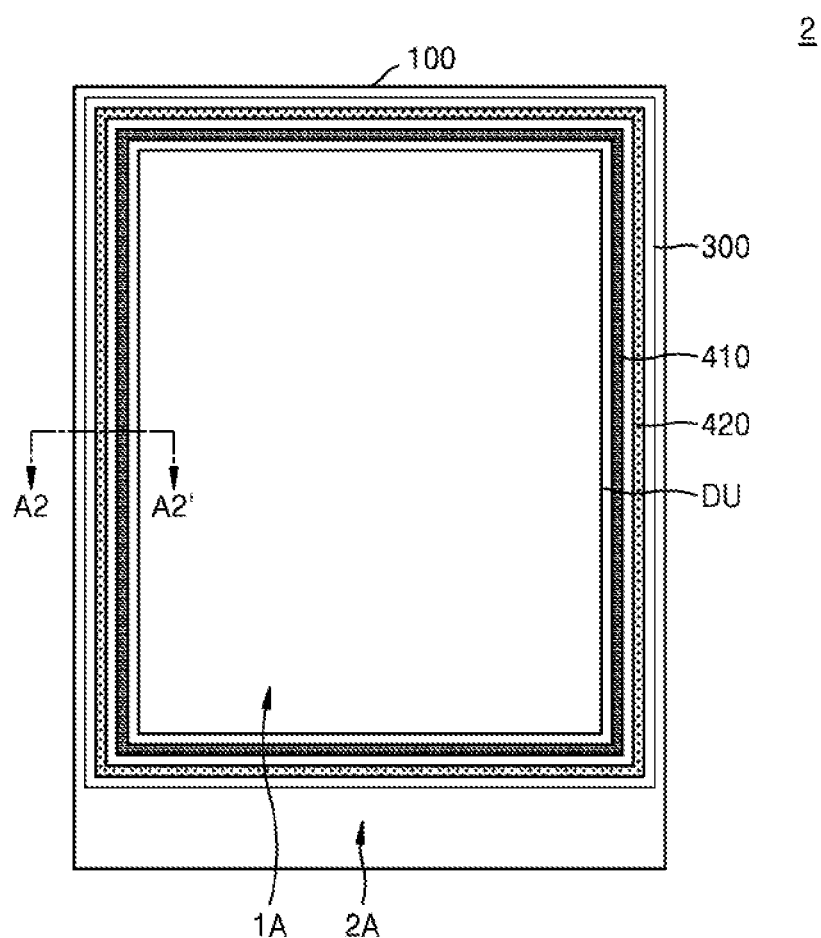
FIG. 4 is a schematic plan view of a display apparatus according to an embodiment.
Figure 5:
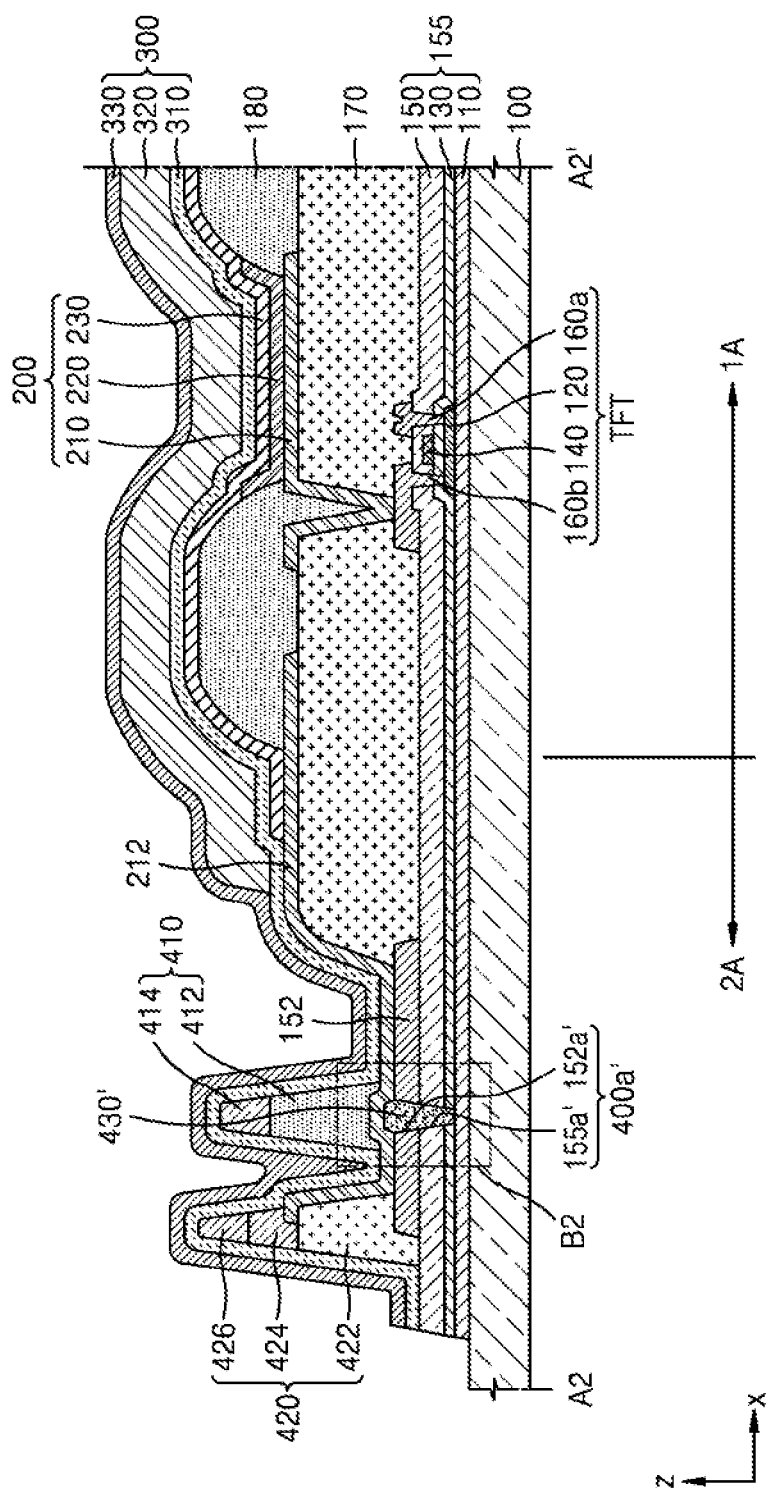
FIG. 5 is a schematic cross-sectional view taken along a line A2-A2' in the display apparatus of FIG. 4 according to an embodiment.
Figure 6:
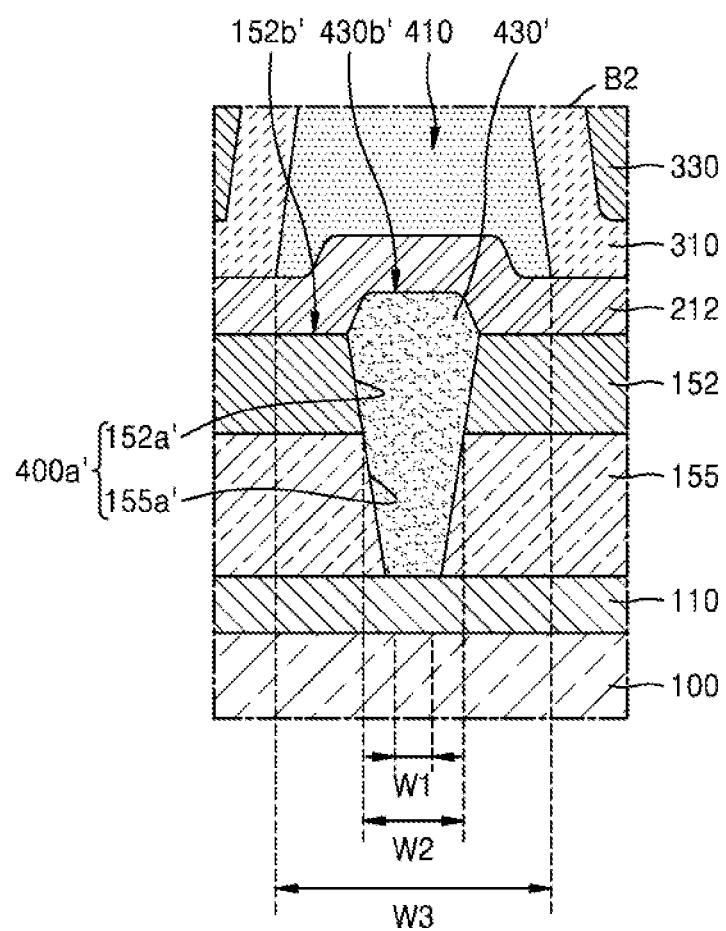
FIG. 6 is a schematic cross-sectional view of a portion B2 indicated in the FIG. 5 according to an embodiment.

FIG. 4 is a schematic plan view of a display apparatus 2 according to an embodiment. FIG. 5 is a schematic cross-sectional view taken along a line A2-A2' in the display apparatus 2 of FIG. 4. FIG. 6 is a schematic enlarged cross-sectional view of a portion B2 in the display apparatus 2 of FIG. 4.

Referring to FIGS. 4 and 5, the display apparatus 2 may include the substrate 100, the display unit DU arranged on the substrate 100 and including the display element 200, the first dam unit 410 arranged outside the display unit DU, the insulating unit 155 having the first opening 155a' arranged on the substrate 100, and the first metal layer 152 having the second opening 152a' at a position corresponding to the first opening 155a'.

The display apparatus 2 illustrated in FIGS. 4 and 5 is different from the display apparatus 1 in the structure of the groove portion 400a including the first opening 155a' and the second opening 152a'. Accordingly, the following description mainly discusses the difference and the above descriptions are used for the other elements including the display unit DU in the first region 1A.

The second region 2A of the substrate 100 is described with reference to FIG. 5.

The second region 2A of the substrate 100 may be understood as an area that surrounds the outside of the first region 1A and includes the edge of the substrate 100. The circuit portions, the interconnection lines, and the like, except for the display element 200, may be arranged in the second region 2A. Furthermore, the via layer 170 and the pixel defining layer 180 including the insulating unit 155 may be disposed across at least a part of the first region 1A and the second region 2A.

In an embodiment, the insulating unit 155 located in the second region 2A may have the first opening 155a' formed along the outside of the first region 1A. In other words, the first opening 155a' may be located in the second region 2A adjacent to the first region 1A. The first opening 155a' may form a closed loop along the first region 1A, or may be formed in an open type in another embodiment.

The first opening 155a' may expose at least a part of the first insulating layer 110 as illustrated in FIG. 5. In other words, in an embodiment, the insulating unit 155 may include the second insulating layer 130 and the third insulating layer 150, and the first opening 155a' may penetrate through the second insulating layer 130 and the third insulating layer 150.

The first metal layer 152 may be disposed on the insulating unit 155. The first metal layer 152 may be arranged on the insulating unit 155 located in the second region 2A, particularly on the third insulating layer 150, as illustrated in FIG. 5. The first metal layer 152 may include the same material as the source electrode or the drain electrode of the TFT located in the first region 1A. The source electrode 160a and the drain electrode 160b of the TFT may be disposed on the third insulating layer 150 corresponding to the interlayer insulating layer. Accordingly, the first metal layer 152 may be disposed on the third insulating layer 150.

The first metal layer 152 may have the second opening 152a'. The second opening 152a' may correspond to the first opening 155a'. Although FIG. 5 illustrates that the first opening 155a' and the second opening 152a' have the same inner side surface, in another embodiment, an inner side surface of the first opening 155a' and an inner side surface of the second opening 152a' may not match each other. The first opening 155a' and the second opening 152a' may be understood as the groove portion 400a located outside the display unit DU. The groove portion 400a may be filled with organic material layer 430.

Although the organic material layer 430 may be formed to be higher than the upper surface 152b of the first metal layer 152, as described above, the height of the organic material layer 430 may be adjusted by using a half-tone or full-tone mask according to the thickness of the insulating unit 155 and/or the first metal layer 152.

The first dam unit 410 may be arranged above the groove portion 400a. In other words, the first opening 155a' and the second opening 152a' may be disposed between the substrate 100 and the first dam unit 410. In an embodiment, although the first dam unit 410 is illustrated as including the first-1 layer 412 and the first-2 layer 414, in some cases, other layers may be further be included. The first-1 layer 412 may include the same material as the pixel defining layer 180 located in the first region 1A. In an embodiment, the first-2 layer 414 may include the same material as the pixel defining layer 180, may be the organic material layer 430 that is formed in a separate process, or may be an inorganic layer. In an embodiment, the first-1 layer 412 may include the same material as the via layer 170. In an embodiment, the first-2 layer 414 may include the same material as the pixel defining layer 180. Furthermore, in an embodiment, unlike the illustration of FIG. 5, the second metal layer 212 may be disposed between the first-1 layer 412 and the first-2 layer 414.

The second metal layer 212 may be disposed between the first dam unit 410 and the groove portion 400a. The second metal layer 212 may be arranged across a part of the first region 1A and a part of the second region 2A. The second metal layer 212 may include the same material as the pixel electrode 210 of the display unit DU.

The second dam unit 420 may be disposed outside the first dam unit 410. The second dam unit 420 may be disposed spaced apart from the first dam unit 410 by a certain interval, and may surround the first dam unit 410. In an embodiment, the height of the second dam unit 420 may be higher than the height of the first dam unit 410. The first dam unit 410 and the second dam unit 420 may be provided to prevent overflow of the organic layer 320, during the formation of the encapsulation portion 300. Although FIG. 5 illustrates that the organic layer 320 of the encapsulation portion 300 is provided to the end area of the pixel defining layer 180, in an embodiment, the organic layer 320 may be arranged by extending to the first dam unit 410. In other words, the organic layer 320 may not overflow to the edge of the substrate 100 by the first dam unit 410, and the organic layer 320 flowing over a part of the first dam unit 410 may be prevented from overflowing by the second dam unit 420.

The second dam unit 420 may include the second-1 layer 422, the second-2 layer 424, and the second-3 layer 426. Although FIG. 5 illustrates that the second dam unit 420 includes the second-1 layer 422, the second-2 layer 424, and the second-3 layer 426 as described above, the second dam unit 420 may further include other layers, or may include the second-1 layer 422 and the second-2 layer 424 only. The second-1 layer 422 may include the same material as the via layer 170 located in the first region 1A. The second-2 layer 424 may include the same material as the pixel defining layer 180. The second-3 layer 426, like the second-2 layer 424, may include the same material as the pixel defining layer 180, may be the organic material layer 430 that is formed in a separate process, and may be an inorganic layer.

The second metal layer 212 may extend between the second-1 layer 422 and the second-2 layer 424 of the second dam unit 420. In an embodiment, the end portion of the second metal layer 212 may not be disposed between the second-1 layer 422 and the second-2 layer 424.

Referring to FIG. 6, the groove portion 400a may be filled with the organic material layer 430. In other words, the first opening 155a' and the second opening 152a' may be filled with the organic material layer 430. In an embodiment, the upper surface 430b' of the organic material layer 430 may be higher than the upper surface 152b' of the first metal layer 152. In an embodiment, the lower surface of the organic material layer 430 may directly contact at least a part of the first insulating layer 110, and may directly contact the inner side surface of the first opening 155a'. In the present embodiment, FIG. 5 or FIG. 6 illustrates that the organic material layer 430 is located only in the second opening 152a'. In an embodiment, the organic material layer 430 may extend to a peripheral portion of the second opening 152a'; that is, a part of the organic material layer 430 may be located on the first metal layer 152.

In an embodiment, the first opening 155a' may have the first width w1, the second opening 152a' may have the second width w2, and the first dam unit 410 may have the third width w3. In FIGS. 5 and 6, the inner side surfaces of the first opening 155a' and the second opening 152a' and the inner side surface of the first dam unit 410 are inclined by a certain angle, not a right angle, with respect to the substrate 100. In other words, the side surfaces of the insulating unit 155 including the first opening 155a', the first metal layer 152 including the second opening 152a', and the first dam unit 410 are illustrated to have a trapezoidal shape. Accordingly, although FIG. 6 illustrates the width with respect to lower portions of the first opening 155a', the second opening 152a', and the first dam unit 410, the "width" may be interpreted to be a width that is not limited to the upper or lower portion of each member. For example, the first width w1 may be a width of the lower portion, the upper portion, or a middle portion of the first opening 155a'.

In an embodiment, the first width w1 of the first opening 155a' may be narrower than the third width w3 of the first dam unit 410. Furthermore, the second width w2 of the second opening 152a' may be narrower than the third width w3 of the first dam unit 410. When each of the first width w1 of the first opening 155a' and the second width w2 of the second opening 152a' is larger than the third width w3 of the first dam unit 410, the height of the first dam unit 410 may be reduced compared to the height according to a related art. In an embodiment, as described above, since the prevention of the overflow of the organic layer 320 that is a function of the first dam unit 410 is not easy, in order to maintain the first dam unit 410, the first and second openings 155a' and 152a' may be formed such that each of the first width w1 of the first opening 155a' and the second width w2 of the second opening 152a' is smaller than the third width w3 of the first dam unit 410.

In an embodiment, the first dam unit 410 may cover the organic material layer 430. As described above, as each of the first width w1 of the first opening 155a' and the second width w2 of the second opening 152a' is smaller than the third width w3 of the first dam unit 410, the organic material layer 430 filling the groove portion 400a may be completely covered by the first dam unit 410.

In the display apparatus 2 according to an embodiment, a crack prevention dam may be provided, in which the groove portion 400a including the first opening 155a' and the second opening 152a' is provided under the first dam unit 410 and the groove portion 400a is filled with the organic material layer 430. The crack prevention dam may block external shock transferred from the edge of the substrate 100 so that transfer of a crack due to the external shock to the display unit DU may be effectively prevented.

Figure 7:
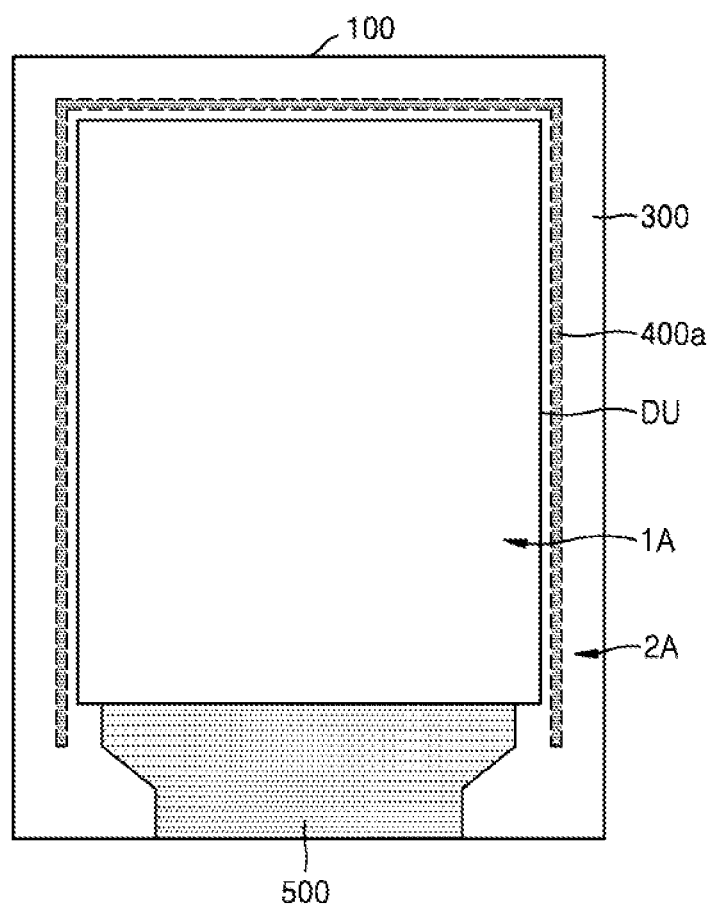
FIG. 7 is a schematic plan view of a display apparatus according to an embodiment.

FIG. 7 is a schematic plan view of a display apparatus 3 according to an embodiment.

Referring to FIG. 7, the display apparatus 3 may include the groove portion 400a disposed outside the display unit DU (which is located in the first region 1A). Although the shape of the cross-section of the groove portion 400a in the display apparatus 3 may be the same as that of the display apparatus 1 of FIG. 2 or the display apparatus 2 of FIG. 5, the structure of the display apparatus 3 a plan view is different from structures the apparatuses 1 and 2 of in plan views.

Referring to FIG. 7, in the display apparatus 3, the substrate 100 may have a rectangular shape, and accordingly, the display unit DU located at the center portion of the substrate 100 may have a rectangular shape as well. Accordingly, the second region 2A may be disposed to surround four surfaces of the display unit DU.

Although not illustrated in FIG. 7, as described above with reference to FIG. 1, the first dam unit 410 and the second dam unit 420 may be arranged in the second region 2A that is the outside of the display unit DU, and the groove portion 400a may be disposed under the first dam unit 410, that is, between the first dam unit 410 and the substrate 100.

In the display apparatuses 1 and 2, the groove portion 400a may completely surround (or enclose) the display unit DU in plan views, in the display apparatus 3, the groove portion 400a may partially surround the display unit DU without enclosing the display unit DU. In the apparatuses 1 and 2, all four sides of the display unit DU have corresponding (and parallel) sections of the groove portion 400a in plan views. In the apparatus 3, only three sides of the display unit DU may have corresponding sections of the groove portion 400a in a plan view. In the apparatus 3, a fan-out portion 500 may be arranged in an area where a side of the display unit DU does not have a corresponding section of the groove portion 400a. Thus, superposition of the fan-out portion 500 may be avoided.

Figure 8:
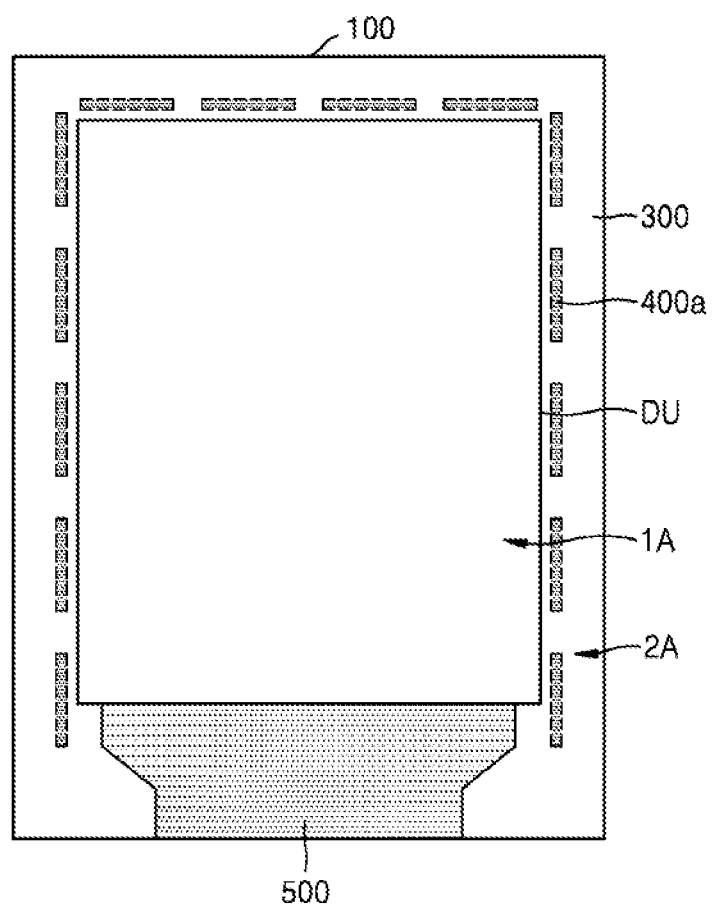
FIG. 8 is a schematic plan view of a display apparatus according to an embodiment.

FIG. 8 is a schematic plan view of a display apparatus 4 according to an embodiment.

Referring to FIG. 8, the display apparatus 4 may include a groove portion 400a (or groove portion set including a plurality of groove portions 400a) disposed outside the display unit DU (which is located in the first region 1A). Although the shape of the cross-section of the groove portion 400a in the display apparatus 4 may be the same as that of the display apparatus 1 of FIG. 2 or the display apparatus 2 of FIG. 5, the structure of the display apparatus 4 in a plan view is different from structures of the apparatuses 1 and 2 in plan views.

Referring to FIG. 8, in the display apparatus 4, the substrate 100 may have a rectangular shape, and accordingly, the display unit DU located at the center portion of the substrate 100 may have a rectangular shape as well. Accordingly, the second region 2A may be disposed to surround the four surfaces of the display unit DU.

Although not illustrated in FIG. 8, as described above with reference to FIG. 1, the first dam unit 410 and the second dam unit 420 may be arranged in the second region 2A that is the outside of the display unit DU, and the groove portion 400a may be disposed under the first dam unit 410, that is, between the first dam unit 410 and the substrate 100.

In the display apparatuses 1 and 2, the groove portion 400a may completely surround (or enclose) the display unit DU in plan views. In the display apparatus 4, the groove portion 400a may partially surround the display unit DU without enclosing the display unit DU in a plan view. In the apparatuses 1 and 2, all four sides of the display unit DU have corresponding (and parallel) sections of the groove portion 400a in plan views. In the apparatus 3, only three sides of the display unit DU may have corresponding sections of the groove portion 400 in a plan view. In the apparatus 4, a fan-out portion 500 may be arranged in the area where a side of the display unit DU does not have a corresponding section of the groove portion 400a. Thus, superposition of the fan-out portion 500 may be avoided.

In the apparatus 4, the groove portion 400a may include grooves (or openings) that are separated from one another by portions of the insulating unit 155 and/or by portions of the first metal layer 152. Interconnection lines (not shown) may be connected between separate grooves (or openings) of the groove portion 400a. The interconnection line may include the same material as the source electrode 160a or the drain electrode 160b of the TFT, or may be the same line as, for example, ELVSS. Accordingly, drop of current may be prevented.

As can be appreciated from above discussion, according to embodiments, a display apparatus may have a maximum display area and may be resistant to external moisture may be implemented.

Embodiments described herein should be considered in a descriptive sense and not for purposes of limitation. Descriptions of features or aspects related to an embodiment may be available for other embodiments.

While one or more embodiments have been described with reference to the figures, various changes in form and details may be made without departing from the spirit and scope defined by the following claims.

What is claimed is:

1. A display apparatus comprising:
   a substrate;
   a display unit overlapping the substrate;
   a first dam unit at least partially surrounding the display unit, wherein a first trench is positioned between the first dam unit and the display unit;
   an insulating unit disposed between the substrate and the first dam unit, having an insulating portion, and having a first opening set, the first opening set being disposed between the insulating portion and the display unit, the insulating portion at least partially surrounding the display unit; and
   a first metal layer having a second opening set, wherein the second opening set exposes the first opening set.

2. The display apparatus of claim 1, wherein the first opening set is disposed between the substrate and the first dam unit.

3. The display apparatus of claim 1, further comprising an organic material layer at least partially disposed inside the first opening set.

4. The display apparatus of claim 3, wherein a first surface of the organic material layer is flush with a first surface of the first metal layer or is positioned closer to the substrate than the first surface of the first metal layer, wherein a second surface of the organic material layer is opposite the first surface of the organic material layer and is positioned between the substrate and the first surface of the organic material layer, and wherein a second surface of the first metal layer is opposite the first surface of the metal layer and is positioned between the substrate and the first surface of the first metal layer.

5. The display apparatus of claim 3, wherein a first surface of the organic material layer is positioned farther from the substrate than a first surface of the first metal layer, wherein a second surface of the organic material layer is opposite the first surface of the organic material layer and is positioned between the substrate and the first surface of the organic material layer, and wherein a second surface of the first metal layer is opposite the first surface of the metal layer and is positioned between the substrate and the first surface of the first metal layer.

6. The display apparatus of claim 3, wherein the organic material layer is disposed completely inside a combination of the first opening set and the second opening set.

7. The display apparatus of claim 3, wherein the organic material layer directly contacts an inner surface of the first opening set.

8. The display apparatus of claim 3, further comprising a second metal layer disposed between the organic material layer and the first dam unit.

9. The display apparatus of claim 8, wherein the display unit comprises an emissive element, a pixel electrode overlapping the emissive element, and a transistor electrically connected to the pixel electrode, and wherein a material of the second metal layer is identical to a material of the pixel electrode.

10. The display apparatus of claim 9, wherein the transistor comprises a semiconductor layer, a gate electrode, and at least one of a source electrode and a drain electrode, and wherein a material of the first metal layer is identical to a material of the at least one of the source electrode and the drain electrode.

11. The display apparatus of claim 8, further comprising a second dam unit at least partially surrounding the first dam unit, wherein a second trench is positioned between the second dam unit and the first dam unit.

12. The display apparatus of claim 11, wherein a maximum height of the second dam unit relative to the substrate is greater than a maximum height of the first dam unit relative to the substrate.

13. The display apparatus of claim 11, wherein the second metal layer directly contacts the second dam unit.

14. The display apparatus of claim 1, wherein the first opening set exposes at least part of the substrate.

15. The display apparatus of claim 1, wherein the insulating unit comprises one or more inorganic insulating layers.

16. The display apparatus of claim 1, wherein the first opening set comprises openings that are separate from one another.

17. The display apparatus of claim 1, wherein the first opening set is narrower than the first dam unit in a direction parallel to the substrate.

18. The display apparatus of claim 1, wherein the second opening set is narrower than the first dam unit in a directly parallel to the substrate.

19. The display apparatus of claim 1, wherein the first dam unit covers the organic material layer such that two edges of the organic material layer are positioned between two edges of the first dam unit.

20. The display apparatus of claim 1, wherein the display unit comprises an emissive element, wherein a maximum height of the first dam unit relative to the substrate is greater than a maximum height of the emissive element relative to the substrate.

* * * * *